US006455897B1

(12) United States Patent
Okawa et al.

(10) Patent No.: US 6,455,897 B1
(45) Date of Patent: Sep. 24, 2002

(54) SEMICONDUCTOR DEVICE HAVING ELECTROSTATIC DISCHARGE PROTECTION CIRCUIT

(75) Inventors: Kazuhiko Okawa; Takayuki Saiki, both of Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/866,782

(22) Filed: May 30, 2001

(30) Foreign Application Priority Data

May 31, 2000 (JP) .......................................... 2000-163022

(51) Int. Cl.[7] .............................................. H01L 29/72
(52) U.S. Cl. ...................... 257/355; 257/356; 257/357; 257/358; 257/360; 257/361; 257/363
(58) Field of Search .................................. 257/355, 356, 257/357, 358, 360, 361, 363

(56) References Cited

U.S. PATENT DOCUMENTS 6,191,454 B1 * 2/2001 Hirata et al. ................. 257/360

FOREIGN PATENT DOCUMENTS

| JP | 2-271673 A | 11/1990 |
| JP | 3-234062 A | 10/1991 |
| JP | 5-136086 A | 6/1993 |
| JP | 7-94595 A | 4/1995 |
| JP | 7-106570 A | 4/1995 |
| JP | 7-273197 A | 10/1995 |

OTHER PUBLICATIONS

U.S. patent application Ser. No. 09/866,800, Okawa et al., filed May 30, 2001.
U.S. patent application Ser. No. 09/873,370, Okawa, filed Jun. 5, 2001.

* cited by examiner

Primary Examiner—Edward Wojciechowicz
(74) Attorney, Agent, or Firm—Oliff & Berridge, PLC

(57) ABSTRACT

A semiconductor device, including an electrostatic discharge protection circuit capable of preventing current from being concentrated in a hot spot through a silicide layer, includes an N-type MOS transistor having a first diffusion region on a semiconductor substrate. This N-type MOS transistor is isolated from another MOS transistor by a first element isolation region. A second diffusion region is formed between the first diffusion region and first element isolation region. The first and second diffusion regions are separated by a second element isolation region. A silicide is formed on the surface of the semiconductor substrate excluding the first and second element isolation regions. A pad is connected to the second N-type diffusion region through a contact. An electrostatic charge injection through the pad and contact is discharged mainly through a first discharge path guided to a channel (P-type well) of the N-type MOS transistor through the second diffusion region (N-type), N-type well under the second element isolation region, and second diffusion region (N-type). A discharge path passing through the silicide layer rarely functions as a discharge path, since the contact resistance value between the silicide layer and first diffusion region is greater than the resistance value of the first diffusion region.

5 Claims, 4 Drawing Sheets

SEMICONDUCTOR DEVICE HAVING ELECTROSTATIC DISCHARGE PROTECTION CIRCUIT

Japanese Patent Application No. 2000-163022, filed May 31,2000, is hereby incorporated by reference in its entirety.

FIELD OF THE INVENTION

The present invention relates to a semiconductor device including an electrostatic discharge protection circuit.

BACKGROUND

A major cause of an electrostatic breakdown phenomenon is silicon dissolution due to heat generated at a PN junction at the time of discharge or occurrence of contact spiking in which a metal of a metal electrode is diffused into a silicon substrate. Conventional countermeasures for static electricity have been carried out taking this point into consideration.

Accompanied by miniaturization of devices, in a miniaturization process with a design rule of 0.35 microns or less, salicide transistors have been developed in order to effectively decrease the resistance of source/drain diffusion layers by employing salicide technology in which a high-melting-point metal silicide layer is formed on the diffusion layers (Japanese Patent Application Laid-open Nos. 7-273197, No. 7-106570, No. 7-94595, No. 5-136086, No. 3-234062, and the like).

The thickness of a gate oxide film, which is normally 135 Angstroms in a device with a supply voltage of 5 V, tends to be decreased as the supply voltage is decreased. In a 0.35-micron-process, the thickness of the gate oxide film is 70 Angstroms in a device with a supply voltage of 3.3 V, for example. In a 0.25-micron-process, the thickness of the gate oxide film is about 50 Angstroms in a device with a supply voltage of 2.5 V. This is a serious hindrance in designing electrostatic discharge protection circuits.

When allowing an electrostatic charge injected from an input/output terminal to be discharged through a power supply terminal, in the case where a silicide layer is present on the junction of a discharge device (such as a MOS transistor) interposed between the input/output terminal and the power supply terminal, the discharge device breaks down at a very low applied voltage.

The cause of the breakdown estimated from delamination analysis results is the occurrence of local current concentration near a gate electrode, because a notch-shaped trace of current flowing near the gate electrode of the MOS transistor occurred.

As a reason why current concentration tends to occur locally, a decrease in the resistance of the diffusion layers by using the salicide technology can be given. In the case of applying a reverse voltage to the N-type MOS transistor, a charge injected from a pad is injected into the diffusion layers from a contact on the drain, and causes avalanche breakdown (electron avalanche) to occur at the junction with a channel region. The charge flowing out into the substrate causes the potential difference necessary for allowing a diode forward current to be produced between a source potential (ground potential) and a substrate potential. This causes a bipolar transistor formed by drain-channel-source to be operated, whereby the current is discharged with the voltage being clamped.

The state of discharge is described below with reference to FIGS. 4 and 5. FIGS. 4 and 5 are plan views showing an N-type MOS transistor including a drain 10, contacts 12 formed on the drain 10, a gate 14, a source 16, and contacts 18 formed on the source 16.

In the case where a silicide layer is not formed on the diffusion layers, the current uniformly flows from the contacts 12 on the drain 10 toward the gate 14 without being concentrated in one spot due to a high diffusion resistance, as shown in FIG. 4.

On the contrary, in the case where a silicide layer is formed on the diffusion layers, when a hot spot 20 is formed as shown in FIG. 5, the current is concentrated from all the contacts 12 on the drain 10 in the hot spot 20. Therefore, current concentration tends to occur even if the applied voltage is low, thereby causing breakdown to occur.

Moreover, the silicide layer cannot be formed flat near the junction, so that the silicide in the shape of a projection is present at a junction edge. Current concentration tends to occur in this area therefore the hot spot tends to occur.

An electrostatic discharge (ESD) withstanding voltage is considered to be decreased for these two reasons in the case where the silicide layer is present on the junction of the discharge device.

Therefore, technology additionally including a protection step for partly removing the silicide layer on the discharge device has been developed (Japanese Patent Application Laid-open No. 2-271673 and the like).

However, the following two problems occur when employing the protection step.

One of the problems is that leakage may occur between the gate and the source/drain. In the protection step, an oxide film is formed over the entire surface of the substrate after forming the source/drain regions and is etched while allowing the area in which the silicide is not formed to remain. A side-wall insulating film which has already been formed on the side of the gate is also removed during the etching so that leakage easily occurs.

The other problem is that high-speed operation of the transistor cannot be expected. In a full salicide process in which the silicide layer is formed on both the gate electrode and the diffusion regions, it is impossible to employ a structure in which the silicide layer is formed on the gate electrode but is not formed near the drain junction. Therefore, preventing the silicide layer from being formed near the drain junction causes a region to be formed on the gate electrode in which the silicide layer is not formed. This results in a sheet resistance of the order of KΩ so that the high-speed operation cannot be expected.

SUMMARY

Accordingly, an objective of the present invention is to provide a semiconductor device including an electrostatic discharge protection circuit capable of preventing current from being concentrated in a hot spot through a low-resistance silicide layer.

Another objective of the present invention is to provide a semiconductor device capable of forming an electrostatic discharge protection circuit without performing a protection step for partly removing a silicide layer.

One aspect of the present invention provides a semiconductor device comprising:

a semiconductor substrate;

a MOS transistor which is formed on the semiconductor substrate and includes a first diffusion region;

a first element isolation region which isolates the MOS transistor from another MOS transistor formed on the semiconductor substrate;

a second element isolation region formed between the MOS transistor and the first element isolation region;

a silicide layer formed in the surface of the semiconductor substrate excluding the first and second element isolation regions;

a second diffusion region which is isolated from the first diffusion region by the second element isolation region; and a contact connected to the first diffusion region through the silicide layer.

Another aspect of the present invention provides a semiconductor device comprising:

a semiconductor substrate;

an N-type MOS transistor which is formed on the semiconductor substrate and includes a first N-type diffusion region;

a first element isolation region which isolates the N-type MOS transistor from another MOS transistor formed on the semiconductor substrate;

second and third element isolation regions formed between the N-type MOS transistor and the first element isolation region;

a silicide layer formed in the surface of the semiconductor substrate excluding the first, second, and third element isolation regions;

a second N-type diffusion region which is isolated from the first N-type diffusion region by the second element isolation region, a third N-type diffusion region which is isolated from the second N-type diffusion region by the third element isolation region;

a first contact connected to the second N-type diffusion region through the silicide layer;

a second contact connected to the third N-type diffusion region through the silicide layer;

an N-type well formed under the first N-type diffusion region, the second element isolation region, and the second N-type diffusion region; and a P-type well formed under the second N-type diffusion region, the third element isolation region, and the third N-type diffusion region, wherein an NPN lateral bipolar transistor formed by the second and third N-type diffusion regions and the P-type well is used as a discharge device.

According to still another aspect of the present invention, the N-type may be replaced by a P-type. In this case, a PNP lateral bipolar transistor functions as the discharge device which is an electrostatic discharge protection circuit for the P-type MOS transistor.

DETAILED DESCRIPTION

Figure 1:
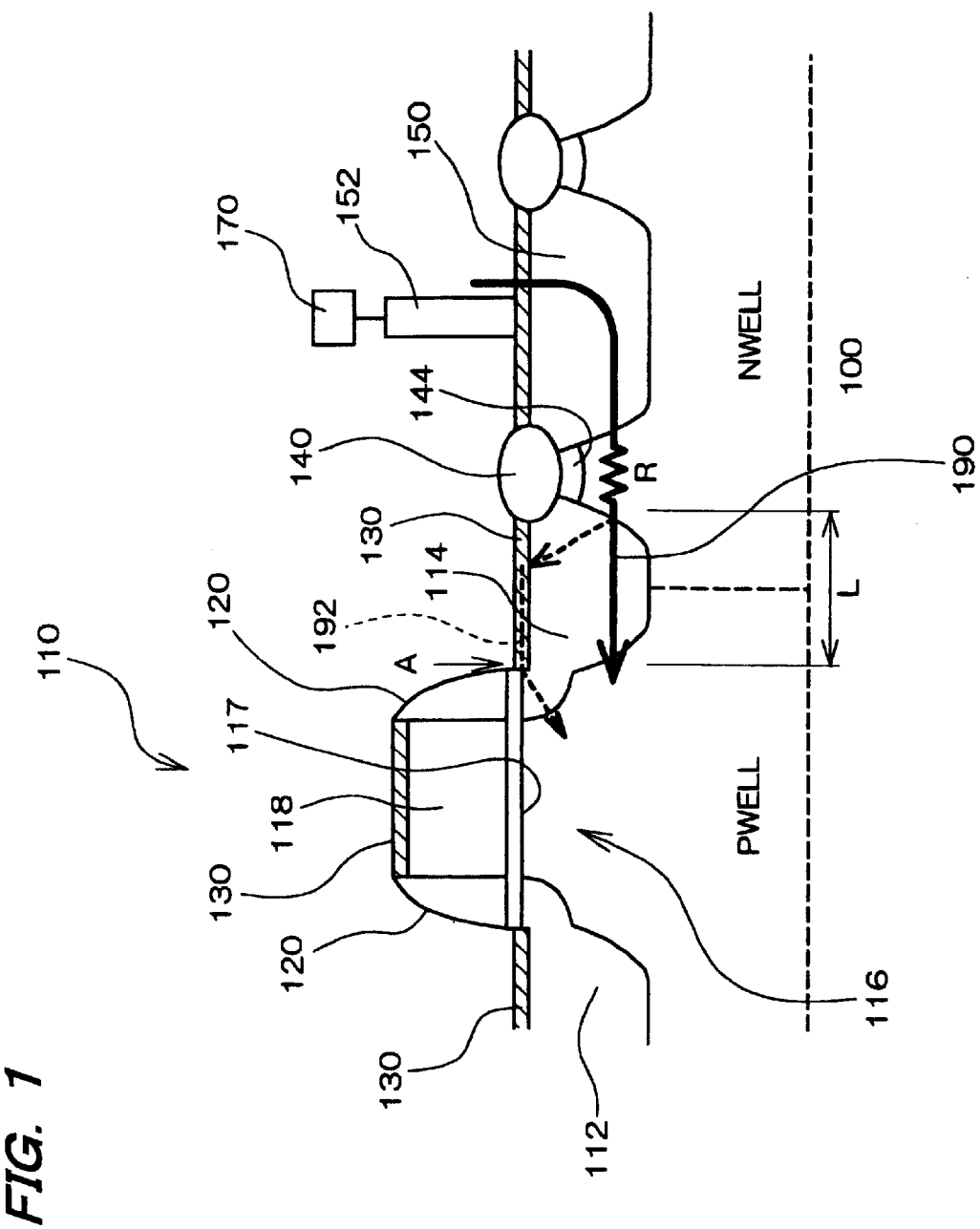
FIG. 1 is a cross-sectional view showing the structure of an N-type MOS transistor and an electrostatic discharge protection circuit for a semiconductor device according to a first embodiment of the present invention.

One embodiment of the present invention provides a semiconductor device comprising:

a semiconductor substrate;

a MOS transistor which is formed on the semiconductor substrate and includes a first diffusion region;

a first element isolation region which isolates the MOS transistor from another MOS transistor formed on the semiconductor substrate;

a second element isolation region formed between the MOS transistor and the first element isolation region;

a silicide layer formed in the surface of the semiconductor substrate excluding the first and second element isolation regions;

a second diffusion region which is isolated from the first diffusion region by the second element isolation region; and a contact connected to the first diffusion region through the silicide layer.

When the MOS transistor is an N-type, each of the first and second diffusion regions may be an N-type diffusion region including an N-type impurity, and an N-type well may be formed under the second element isolation region and the first and second diffusion regions. When the MOS transistor is P-type, each of the first and second diffusion regions may be a P-type diffusion region including a P-type impurity, and a P-type well may be formed under the second element isolation region and the first and second diffusion regions.

According to this embodiment of the present invention, the silicide layer formed in the surface of a discharge device as a discharge path for static electricity injected from the contact is divided by the second element isolation region. Therefore, there is no discharge path passing directly through the silicide layer from the contact. In this semiconductor device, a discharge path passing through the contact, the second diffusion region, the well, the first diffusion region, and the channel mainly functions as a discharge path which allows an electrostatic charge injected from the contact to be discharged. A discharge path from the first diffusion region to the channel through the silicide layer rarely functions as a discharge path, since the contact resistance value between the silicide layer and the first diffusion region is greater than the resistance value of the first diffusion region. Therefore, since the current is not concentrated in the silicide layer, the risk of allowing a hot spot to occur at a junction edge can be prevented even if the silicide layer is not formed flat at the junction edge.

Another embodiment of the present invention provides a semiconductor device comprising:

a semiconductor substrate;

an N-type MOS transistor which is formed on the semiconductor substrate and includes a first N-type diffusion region;

a first element isolation region which isolates the N-type MOS transistor from another MOS transistor formed on the semiconductor substrate;

second and third element isolation regions formed between the N-type MOS transistor and the first element isolation region;

a silicide layer formed in the surface of the semiconductor substrate excluding the first, second, and third element isolation regions;

a second N-type diffusion region which is isolated from the first N-type diffusion region by the second element isolation region, a third N-type diffusion region which is isolated from the second N-type diffusion region by the third element isolation region;

a first contact connected to the second N-type diffusion region through the silicide layer;

a second contact connected to the third N-type diffusion region through the silicide layer;

an N-type well formed under the first N-type diffusion region, the second element isolation region, and the second N-type diffusion region; and a P-type well formed under the second N-type diffusion region, the third element isolation region, and the third N-type diffusion region, wherein an NPN lateral bipolar transistor formed by the second and third N-type diffusion regions and the P-type well is used as a discharge device.

According to this embodiment of the present invention, the NPN lateral bipolar transistor functions as a discharge device which is an electrostatic discharge protection circuit for the N-type MOS transistor. Specifically, an electrostatic charge injected through the first N-type diffusion region of the N-type MOS transistor is discharged through the NPN lateral bipolar transistor. In order to prevent the N-type MOS transistor from functioning as the discharge path, the first and second N-type diffusion regions are separated by the second element isolation region, and the resistance formed by the N-type well is formed therebetween. This resistance is inserted between a collector of the NPN lateral bipolar transistor and the drain of the N-type MOS transistor in the equivalent circuit, for example. The discharge path toward the N-type MOS transistor is cut off by the resistance value of this resistance.

Moreover, since the silicide layer connected to the first contact is divided by the second element isolation region, an electrostatic charge does not flow into the N-type MOS transistor through the silicide layer. Therefore, there is no need to perform a protection step for partly removing the silicide layer.

According to still another embodiment of the present invention, the N-type may be replaced by a P-type. In this case, a PNP lateral bipolar transistor functions as the discharge device which is an electrostatic discharge protection circuit for the P-type MOS transistor.

Specific examples of the embodiments of the semiconductor device to which the present invention is applied are described below with reference to the drawings.

First Embodiment (1) Structure of N-type MOS Transistor and Electrostatic Discharge Protection Circuit FIG. 1 shows a cross-sectional structure of an N-type MOS transistor and an electrostatic discharge protection circuit for the N-type MOS transistor. In FIG. 1, an N-type MOS transistor 110 is formed on a silicon substrate 100. The N-type MOS transistor 110 includes an $N^+$ source 112, an $N^+$ drain (first drain: first diffusion region) 114, a channel 116 of a P-type well present therebetween, and a gate 118 which faces the channel 116 through a gate oxide film 117. A side-wall insulating film 120 is formed on the side wall of the gate 118. A silicide layer 130 is formed on the source 112, drain 114, and gate 118, whereby the N-type MOS transistor 110 is formed as a salicide transistor.

In FIG. 1, in addition to a first element isolation region (not shown) for isolating each of the transistors, a second element isolation region 140 formed by a LOCOS process in the same manner as the first element isolation region is formed. The second element isolation region 140 separates the drain of the N-type MOS transistor 110 into the first drain 114 and a second drain (second diffusion region) 150. A P stopper diffusion region 144 is formed under the second element isolation region 140. FIG. 1 illustrates a condition in which a contact 152 connected to the second drain 150 is connected to a pad 170.

In the semiconductor substrate 100, a P-type well is formed on the side of the N-type MOS transistor 110, and an N-type well is formed on the side of the second drain 150 with the first drain 114 present therebetween.

(2) Operation of Electrostatic Discharge Protection Circuit for N-type MOS Transistor The silicide layer 130 formed on the surface of a discharge device as a discharge path for static electricity injected from the pad 170 is divided by the second element isolation region 140. Therefore, there is no discharge path passing directly through the silicide layer 130 from the pad 170 and the contact 152.

In the semiconductor device shown in FIG. 1, a first discharge path 190 indicated by the solid line and a second discharge path 192 indicated by the broken line are illustrated as two discharge paths for allowing an electrostatic charge injected from the pad 170 to be discharged.

The first discharge path 190 is a major discharge path passing through the pad 170, contact 152, second drain 150, N-type well (resistance R), first drain 114, and channel 116.

The second discharge path 192 is a second discharge path passing through the pad 170, contact 152, second drain 150, N-type well (resistance R), first drain 114, silicide layer 130, first drain 114, and channel 116.

The resistance of the first discharge path 190 is decreased as the length L shown in FIG. 1 decreases, whereby the first discharge path 190 functions as a major discharge path.

In the second discharge path 192, the contact resistance value between the silicide layer 130 and the first drain 114 is greater than the resistance value of the first drain 114. Therefore, even if the resistance of the silicide layer 130 is low, the total resistance value of the second discharge path 192 is greater than the total resistance value of the first discharge path 190. This is why the secondary discharge path 192 only functions as a secondary discharge path.

As described above, according to the electrostatic discharge protection circuit shown in FIG. 1, the current is not concentrated in the silicide layer 130. Therefore. even if the silicide layer 130 is not formed flat at the junction edge indicated by an arrow A shown in FIG. 1, the risk of allowing a hot spot to occur at the junction edge can be prevented.

Second Embodiment

A semiconductor device according to a second embodiment of the present invention is described below.

Figure 2:
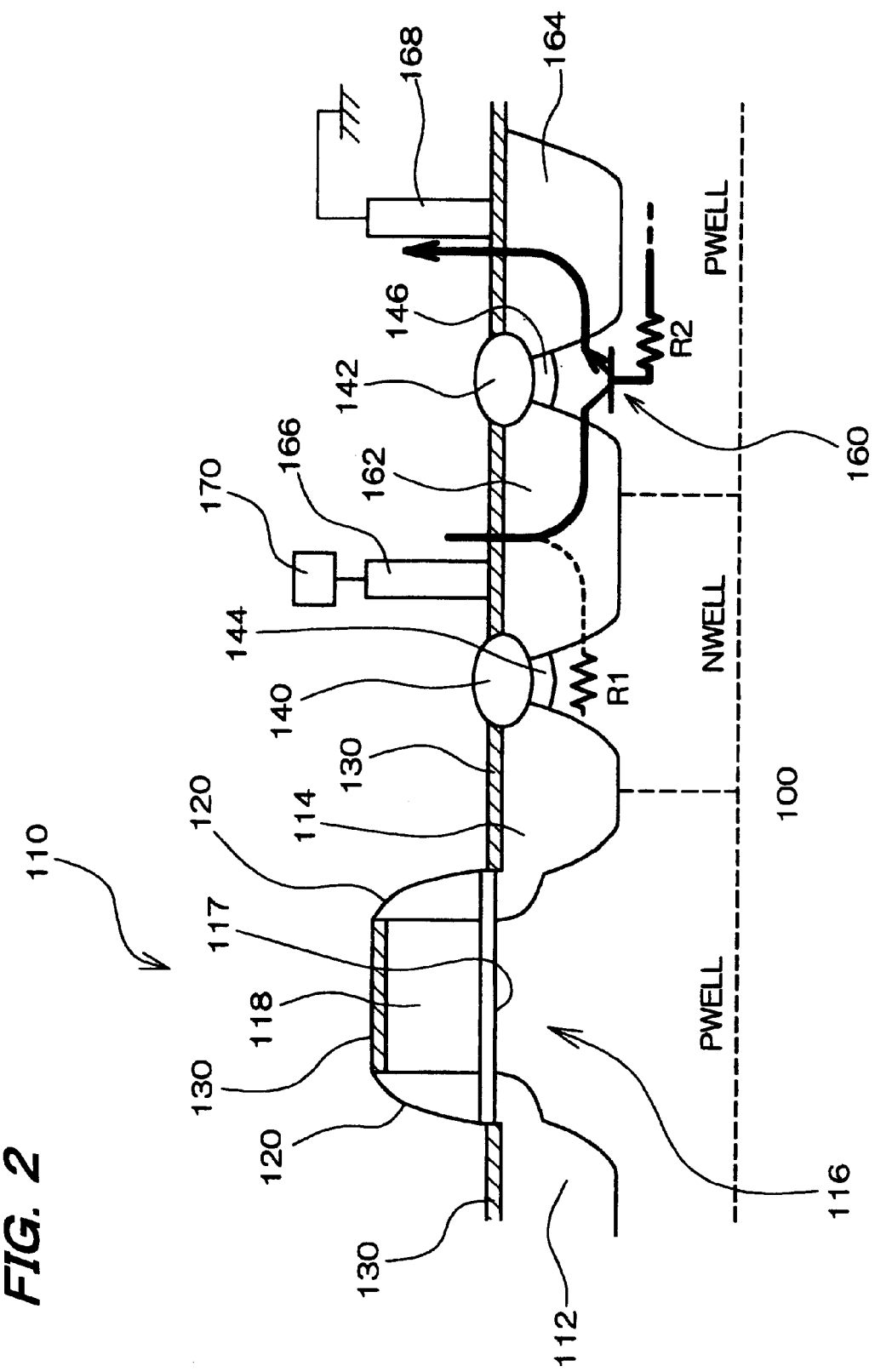
FIG. 2 is a cross-sectional view showing the structure of an N-type MOS transistor and an electrostatic discharge protection circuit for a semiconductor device according to a second embodiment of the present invention.

(1) Structure of Electrostatic Discharge Protection Circuit for N-type MOS Transistor FIG. 2 is a cross-sectional view showing the structure of an N-type MOS transistor and an electrostatic discharge protection circuit therefor according to the second embodiment of the present invention. In FIG. 2, components the same as those shown in FIG. 1 are indicated by the same symbols.

In the semiconductor device shown in FIG. 2, in addition to a first element isolation region for isolating the N-type MOS transistor 110 from other MOS transistors, a second element isolation region 140 and a third element isolation region 142 are formed by a LOCOS process in the same manner as the first element isolation region. In FIG. 2, an N+ diffusion region separated from the drain 114 through the second element isolation region 140 is called a collector (second diffusion region) 162. An emitter (third diffusion region) 164 which is an N+ diffusion region is formed in the region separated from the collector 162 through the third element isolation region 142. P stopper regions 144 and 146 are formed under the second and third element isolation regions 140 and 142.

In the semiconductor device shown in FIG. 2, an N-type well is formed under the drain 114, the second element isolation region 140, and the collector 162. A P-type well is formed under the collector 162, the third element isolation region 142, and the emitter 164.

The collector 162, the emitter 164, and the P-type well make up an NPN lateral bipolar transistor 160. FIG. 2 shows a first contact 166 connected to the collector 162 and a second contact 168 connected to the emitter 164. The first contact 166 is connected to the pad 170. The second contact is connected to the power supply terminal (GND).

Figure 3:
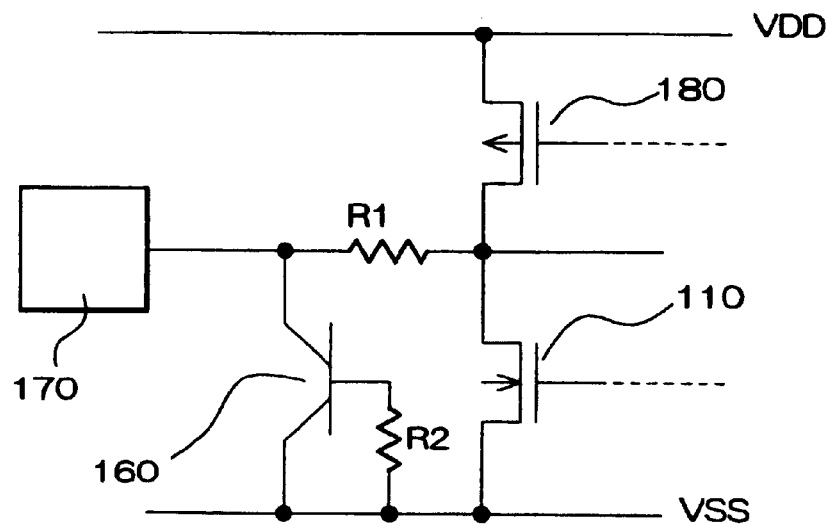
FIG. 3 is an equivalent circuit diagram showing the semiconductor device shown in FIG. 2.
Figure 4:
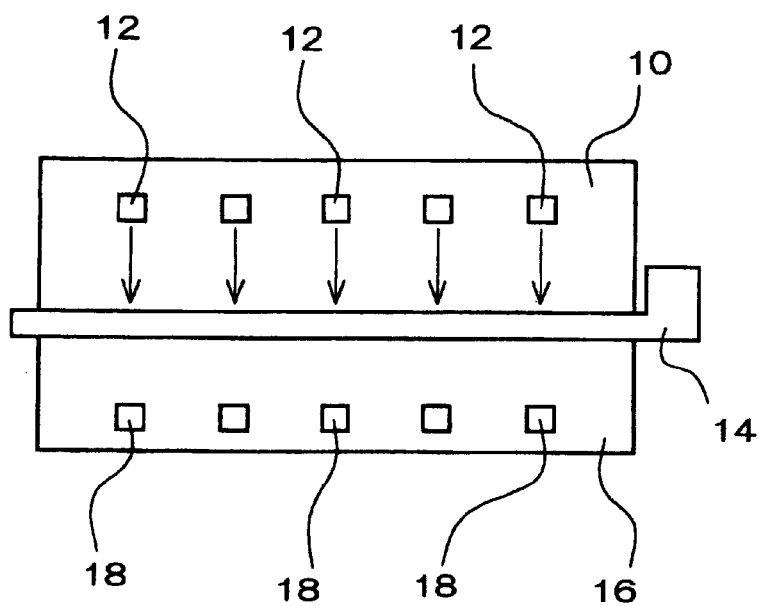
FIG. 4 is a view schematically showing the state of uniform discharge in a conventional case where a silicide layer is not formed on diffusion layers.
Figure 5:
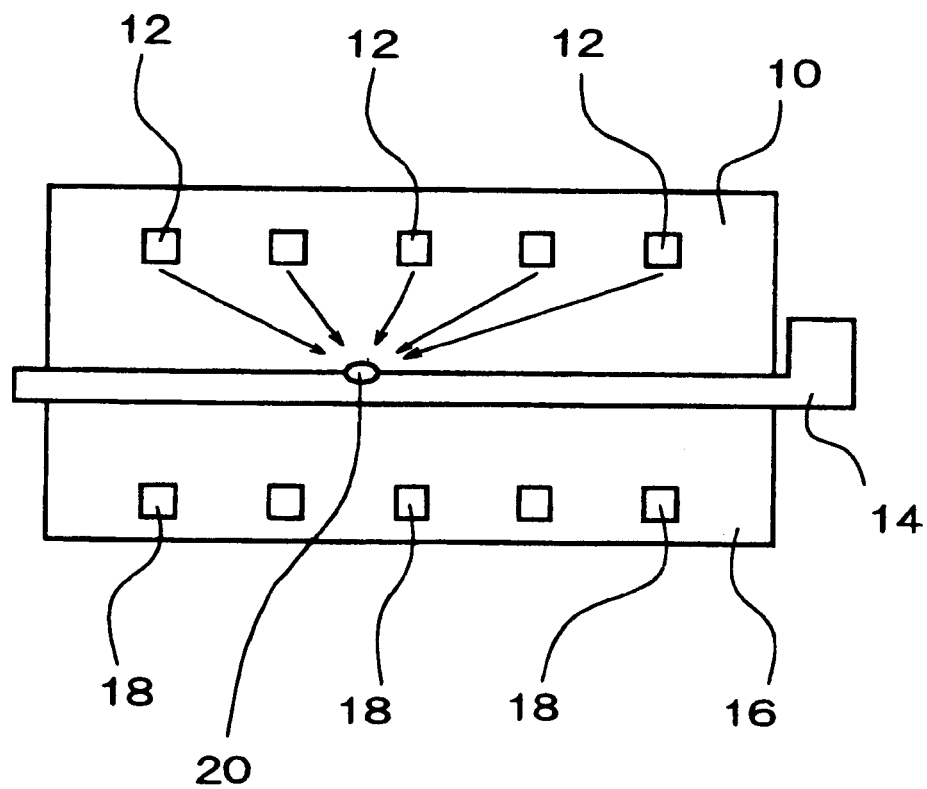
FIG. 5 is a view schematically showing the state of discharge in a conventional case where a silicide layer is formed on diffusion layers, in which current is concentrated in a hot spot.

FIG. 3 is shows an equivalent circuit formed by the semiconductor structure shown in FIG. 2. The N-type MOS transistor 110, the NPN lateral bipolar transistor 160, the pad 170, a P-type MOS transistor 180 formed in pairs with the N-type MOS transistor 110, and resistances R1 and R2 are shown in FIG. 3. The N-type MOS transistor 110 sets the potential of the pad 170 to a VSS potential. The P-type MOS transistor 180 sets the potential of the pad 170 to a VDD potential.

The resistance R1 shown in FIG. 3 is formed by the N-type well under the second element isolation region 140 shown in FIG. 2. The resistance R2 is formed by the P-type well under the third element isolation region 142 and the emitter 164.

(2) Operation of Electrostatic Discharge Protection Circuit for N-type MOS Transistor In FIG. 2, the silicide layer 130 formed in the surface of the discharge device as the discharge path for an electrostatic charge injected from the pad 170 is divided by the second element isolation region 140. Therefore, there is no discharge path passing directly through the silicide layer 130 from the pad 170 and the first contact 166 toward the N-type MOS transistor 110.

In the electrostatic discharge protection circuit for the N-type MOS transistor 110 shown in FIGS. 2 and 3, the NPN lateral bipolar transistor 160 functions as the discharge device. Specifically, an electrostatic charge injected from the pad 170 is discharged through the first contact 166, the collector 162 of the NPN lateral bipolar transistor 160, the emitter 164 of the NPN lateral bipolar transistor 160, the second contact 168, and GND in that order.

In this case, since the MOS transistor 110 and the NPN lateral bipolar transistor 160 are connected in parallel to the pad 170, as shown in FIG. 3, it is necessary to cut off the discharge path toward the MOS transistor 110.

Therefore, the resistance R1 which blocks current toward the N-type MOS transistor 110 is formed between the collector 162 and the drain 114 of the N-type MOS transistor 110, as shown in FIGS. 2 and 3.

The present invention is not limited to the above-described embodiments. Various modifications and variations are possible without departing from the spirit and the scope of the present invention.

Each of the above embodiments illustrates an example using a P-type semiconductor substrate. However, the above embodiments can be carried out in the same manner using an N-type semiconductor substrate. In this case, the N-type and P-type in FIGS. 1 and 2 are respectively replaced by a P-type and N-type. In the case of modifying the embodiment shown in FIG. 2 by using an N-type semiconductor substrate, a PNP lateral bipolar transistor which protects a P-type MOS transistor is formed. However, the P stopper regions 144 and 146 shown in FIGS. 1 and 2 are not needed.

Use of a semiconductor substrate having a triple-well structure enables the formation of an NPN lateral bipolar transistor which functions as a protection circuit for an N-type MOS transistor and a PNP lateral bipolar transistor which functions as a protection circuit for a P-type MOS transistor on the same semiconductor substrate.

What is claimed is:

1. A semiconductor device, comprising:
   a semiconductor substrate;
   a MOS transistor which is formed over the semiconductor substrate, the MOS transistor including a first diffusion region;
   a first element isolation region, which isolates the MOS transistor from another MOS transistor formed over the semiconductor substrate;
   a second element isolation region formed between the MOS transistor and the first element isolation region;
   a silicide layer formed over the surface of the semiconductor substrate excluding the first and second element isolation regions;
   a second diffusion region, which is isolated from the first diffusion region by the second element isolation region; and
   a contact connected to the second diffusion region through the silicide layer.

2. The semiconductor device according to claim 1,
   the MOS transistor being N-type,
   each of the first and second diffusion regions being an N-type diffusion region that includes an N-type impurity, and
   an N-type well being formed under the second element isolation region and the first and second diffusion regions.

3. The semiconductor device according to claim 1,
   the MOS transistor being P-type,
   each of the first and second diffusion regions being a P-type diffusion region that includes a P-type impurity, and
   a P-type well being formed under the second element isolation region and the first and second diffusion regions.

4. A semiconductor device, comprising:
   a semiconductor substrate;
   an N-type MOS transistor which is formed over the semiconductor substrate, the N-type MOS transistor including a first N-type diffusion region;
   a first element isolation region, which isolates the N-type MOS transistor from another MOS transistor formed over the semiconductor substrate;
   second and third element isolation regions formed between the N-type MOS transistor and the first element isolation region;
   a silicide layer formed over the surface of the semiconductor substrate excluding the first, second, and third element isolation regions;
   a second N-type diffusion region, which is isolated from the first N-type diffusion region by the second element isolation region, a third N-type diffusion region, which is isolated from the second N-type diffusion region by the third element isolation region;

a first contact connected to the second N-type diffusion region through the silicide layer;

a second contact connected to the third N-type diffusion region through the silicide layer;

an N-type well formed under the first N-type diffusion region, the second element isolation region, and the second N-type diffusion region; and a P-type well formed under the second N-type diffusion region, the third element isolation region, and the third N-type diffusion region, wherein an NPN lateral bipolar transistor, formed by the second and third N-type diffusion regions and the P-type well, is operable as a discharge device.

5. A semiconductor device, comprising:

a semiconductor substrate;

a P-type MOS transistor, which is formed over the semiconductor substrate, the P-type MOS transistor including a first P-type diffusion region;

a first element isolation region, which isolates the P-type MOS transistor from another MOS transistor formed on the semiconductor substrate;

second and third element isolation regions formed between the P-type MOS transistor and the first element isolation region;

a silicide layer formed over the surface of the semiconductor substrate excluding the first, second, and third element isolation regions;

a second P-type diffusion region, which is isolated from the first P-type diffusion region by the second element isolation region;

a third P-type diffusion region, which is isolated from the second P-type diffusion region by the third element isolation region;

a first contact connected to the second P-type diffusion region through the silicide layer;

a second contact connected to the third P-type diffusion region through the silicide layer;

a P-type well formed under the first P-type diffusion region, the second element isolation region, and the second P-type diffusion region; and an N-type well formed under the second P-type diffusion region, the third element isolation region, and the third P-type diffusion region, wherein a PNP lateral bipolar transistor, formed by the second and third P-type diffusion regions and the N-type well, is operable as a discharge device.

* * * * *